(12) United States Patent
Chen et al.

(10) Patent No.: US 6,714,421 B2
(45) Date of Patent: Mar. 30, 2004

(54) FLIP CHIP PACKAGE SUBSTRATE

(75) Inventors: Kun-Ching Chen, Tainan (TW); Ho-Ming Tong, Taipei (TW); Chun-Chi Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/249,369

(22) Filed: Apr. 3, 2003

(65) Prior Publication Data

US 2004/0026797 A1 Feb. 12, 2004

(51) Int. Cl.$^7$ ................................................. H05K 7/06
(52) U.S. Cl. ..................... 361/777; 174/260; 174/262; 257/723
(58) Field of Search ................ 361/767, 768, 361/777, 783; 174/260–262; 257/723, 778

(56) References Cited

U.S. PATENT DOCUMENTS 4,489,365 A * 12/1984 Daberkoe .................. 361/768
5,237,131 A * 8/1993 Catlin ........................ 174/261
6,011,695 A * 1/2000 Dumke ...................... 361/777

* cited by examiner

Primary Examiner—John B. Vigushin
(74) Attorney, Agent, or Firm—Jiang Chyun IP Office

(57) ABSTRACT

A flip chip package substrate is disclosed. The substrate is correspondingly flip chip bonded to a first chip, a second chip, and so on, wherein these chips are of similar type of pad arrangement but of different pad pitches. The top face of the flip chip package substrate is provided with a plurality of bump pad groups, and these bump pad groups are respectively provided with a plurality of bump pads in the sequence of a first bump pad, a second bump pad, and so on, and a plurality of bump pads of the same bump pad group are electrically connected with each other, and the positions of the first bump pads are respectively corresponding to the positions of the second pads, and the rest may be inferred by analogy. Hence, these chips share the same flip chip package substrate.

5 Claims, 3 Drawing Sheets

FLIP CHIP PACKAGE SUBSTRATE

CROSS REFERENCE TO RELATED APPLICATIONS

This application claims the priority benefit of Taiwan application serial no. 91117856, filed Aug. 08, 2002.

BACKGROUND OF THE INVENTION

The present invention relates to a chip package substrate, and in particular to a flip chip package substrate which can be flip chip interconnected to a set of chips having pads in a same similar pad arrangement but with different pad pitches.

Flip Chip Interconnect Technology (FC) essentially makes use of area array method to deposit pads onto the active surface of the chip, and bumps are formed respectively onto the pads. After the chip is flipped over, the bumps on the chip are used to correspondingly connect to contacts of the carrier. Thus, the chip can be electrically connected to the carrier via the bumps, and via the inner circuit of the carrier, the chip can be electrically connected to the external electronic device. Due to the fact that flip chip technology is suitable for a chip package with a high pin count and has the advantages of minimizing chip package area and minimizing short message transmission path, such that flip chip interconnect technology has been widely applied in the field of chip package. Currently, commonly found chip package structure has employed the flip chip interconnect technology includes a few types of chip package structure, such as Flip Chip Ball Grip Array (FCBGA) and Flip Chip Pin Grid Array (FCPGA).

Referring to FIG. 1, which shows a sectional view of a conventional flip chip ball grid array (FCBGA) type of a chip package structure. The active surface 12 of the flip chip 10 is provided with a plurality of pads 14 for signal transmission output terminals of the chip 10. The pads 14 are provided individually with a bump 30 for connection to the bump pads 24 deposited on the top face of the flip chip package substrate 20. The substrate 20 is formed from the stacking of a plurality of patterned conductive layers 23 and a plurality of insulation layers 26. A plurality of conductive vias 28 respectively pass through the insulation layers 26 to electrically connect two or more than two layers of conductive layers 23, wherein the conductive vias 28 include through holes 28a and vias 28b. The through holes and the vias are of different sizes as a result of different fabrication processes. Further, the bump pads on the top face 21 of the substrate 20 are formed of these top layers (conductive layer 23a). Solder mask 27a is used to protect the conductive layer 23a and at the same time to expose the bump pads 24 formed of the conductive layer 23a.

Referring to FIG. 1, the bottom face 22 of the substrate 20 is deposited with a plurality of ball pads 25 which are formed of the lowest one of the conductive layer 23 (e.g. conductive layer 23b). And similarly, a patterned solder mask 27b is used to protect the conductive layer 23b and at the same time to expose the ball pads of the conductive layer 23b. The ball pads 25 can be respectively deposited a ball 40 or other conductive structure thereon so as to electrically connect the ball pads 25 to the external electronic device. Thus, via bumps 30, the pads 14 of the chip 10 can be electrically and mechanically connected to the corresponding bump pads 24 of the substrate 20. Then via the inner circuit formed of conductive layers 23 and conductive vias 28, the pads 14 of the chip 10 can route to the ball pads 25 on the bottom face 22 of the substrate 20. Finally, via the balls 40 on the ball pads 25 or other conductive structures, the pads 14 of the chip 10 can be electrically and mechanically connected to the electronic device of next level, for instance PCB.

Referring to FIG. 1, when the area of the chip 10 is reduced, the pitches of the pads 14 on the chip 10 will be reduced proportionally. As a result the positions of the bump pads 24 on the substrate 20 must respectively correspond to the positions of the pads 14 of the chip with reduced area. Accordingly, the substrate 20 has to be re-designed, in particular the positions of all the bump pads 24 of the substrate 20 must be re-designed. Thus, the process time of the flip chip package of the chip 10 cannot be effectively reduced.

SUMMARY OF THE INVENTION

In view of the above, the object of the present invention is to provide a flip chip package substrate which can connect to a set of chips having pads in a similar pad arrangement but with different pad pitches by flip chip bonding. Therefore, these chips can co-share a flip chip package substrate. Thus, the design procedure for a new flip chip package substrate can be reduced, and therefore the process time of chips connected onto the flip chip package is reduced.

According to the object of the present invention, the present invention provides a flip chip package substrate suited for flip chip bonding to either a first chip or a second chip, wherein the first chip is provided with a first active surface and a plurality of first pads, and the first pads are deposited on the first active surface, and the second chip is provided with a second active surface and a plurality of second pads, and the second pads are deposited on the second active surface corresponding to the arrangement of the first pads. The flip chip package substrate comprises: a plurality of patterned conductive layers inter-stacked in sequence; at least an insulation layer positioned between two adjacent conductive layers for isolation the conductive layers and is inter-stacked with the conductive layers; and a plurality of conductive vias respectively passing through the insulation layer for electrically connection of the conductive layers; wherein the top layer of the conductive layers is provided with a plurality of bump pad groups and the groups are respectively provided with a first bump pad and a second bump pad, and the first bump pad and the second bump pad of the same bump pad group are electrically connected with each other, and the positions of the first bump pads are respectively corresponding to the positions of the first pads of the first chip, and the positions of the second bumps are respectively corresponding to the positions of the second pads of the second chip.

A better understanding of the nature and advantages of the flip chip package substrate of the present invention may be gained with reference to the detailed description and drawings below:

DETAILED DESCRIPTION

The flip chip package substrate of the present invention is capable of flip chip bonding to a set of chips having pads in a similar pad arrangement but with different bump pad pitches.

Figure 1:
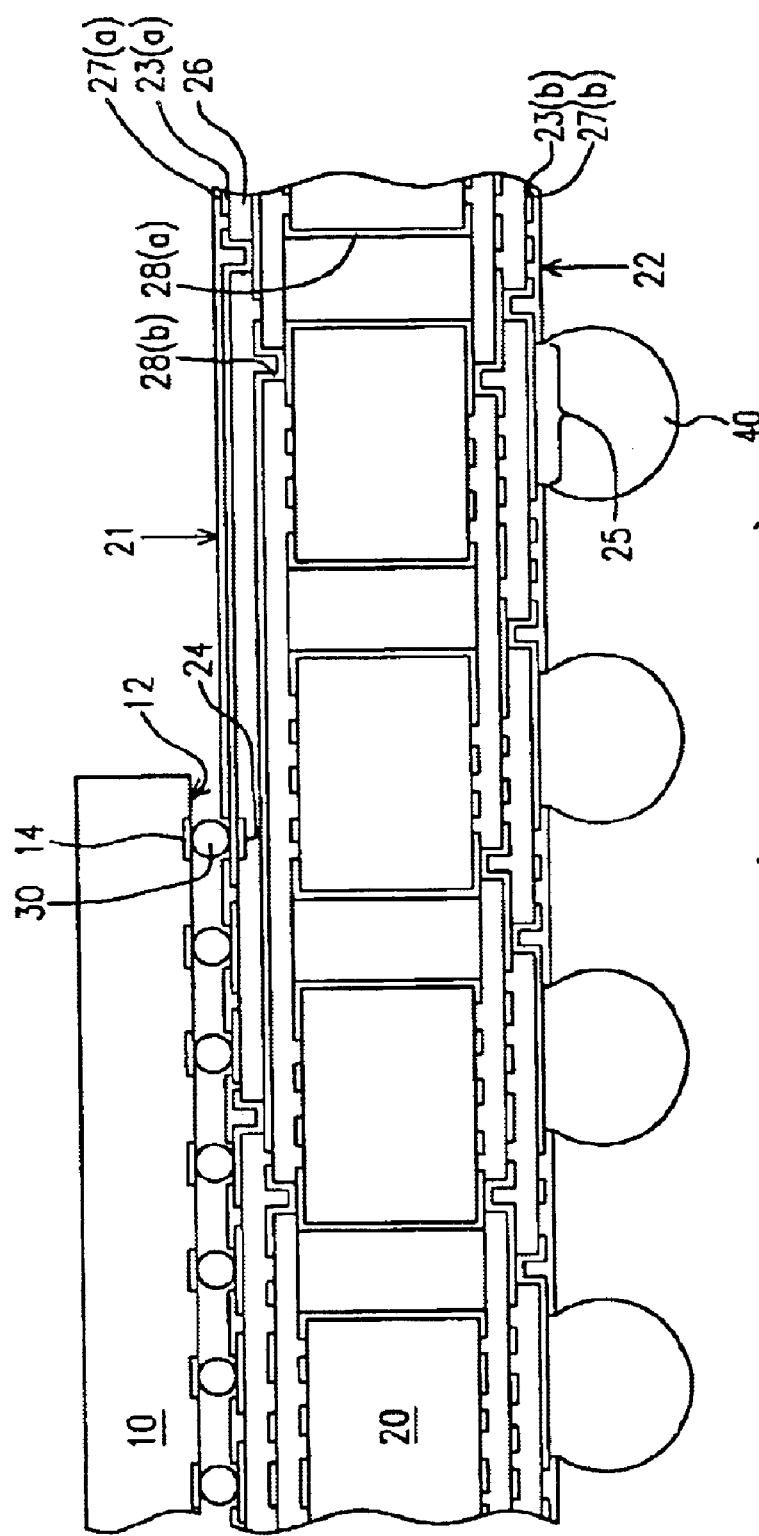
FIG. 1 is a sectional view of a conventional flip chip ball grid array (FCBGA) type of a chip package structure.

The flip chip package of the present invention is formed by stacking patterned conductive layers and insulation layers, and conductive vias are used to pass through the insulation layers and electrically connect two or more than two layer of conductive layers, respectively. The top layer of the conductive layer is formed with a plurality of bump pads such that the pads of the chip are electrically connected to the bump pads of the flip chip substrate via the bumps. Further, via the internal circuit formed of the conductive layer of the flip chip package substrate and the conductive vias, the pads of the chip routes to the bottom face of the flip chip package substrate. Then, via the balls and other conductive structure, the pads of the chip electrically connect to the external electronic device, for instance, printed circuit board. The structure of the flip chip package substrate is shown in FIG. 1 and further description is not needed herein.

Figure 2:
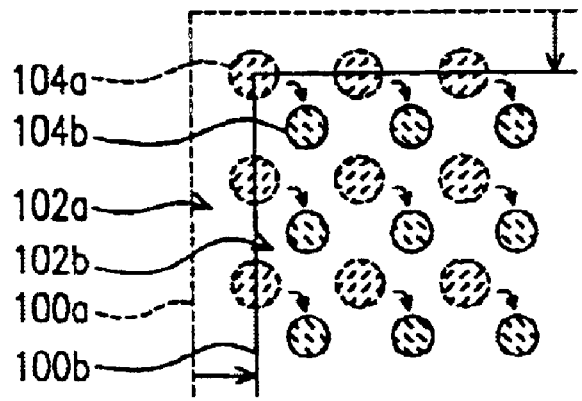
FIG. 2 is a partial bottom view of the two chips having pads in a similar pad arrangement but with different pad pitches.

Referring to FIG. 2, which shows two chips having pads in a similar pad arrangement but with different pad pitches. The first chip 100a is provided with a first active area 102a and a plurality of first pads 104a, wherein the active area 102a refers to one face of the first chip 100a having active devices. The first pads 104a are deposited onto the first active surface 102a of the first chip 100a in an area array.

Figure 3:
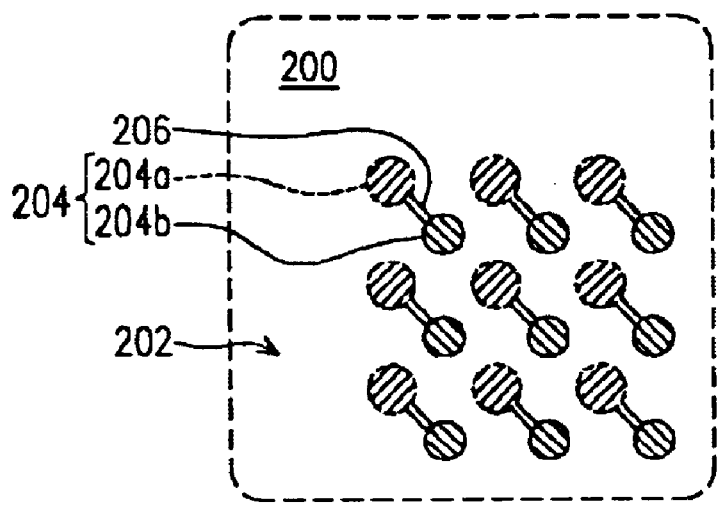
FIG. 3 is a partial top view of a flip chip package substrate in accordance with the preferred embodiment of the present invention.

Referring to FIG. 3, there is shown a top view of the flip chip package structure in accordance with the preferred embodiment of the present invention. The top face of the flip chip package substrate 200 is deposited with a plurality of bump pads groups 204 that are formed of the top layer of conductive layers of the substrate 200 (e.g. conductive layer 23a in FIG. 1). These bump pad groups 204 respectively possess at least two bump pads, for instance a first bump pad 204a and a second bump pad 204b, wherein the positions of the first bump pads 204a are corresponding to those of the first pads 104a in FIG. 2. Thus, the substrate 200 can be correspondingly flip chip bonded to the first pads 104a of the first chip 100a via the first bump pads 204a of the bump pad groups 204.

Referring to FIG. 2, in order to improve the chip number by dicing a single wafer or for other reasons, when the area of the first chip 100a is reduced to that of the second chip 100b. If based on the conventional technology, another type of bump pad arrangement of flip chip package substrate has to be re-designed so as to correspondingly flip chip bonded to a second flip chip 100b. It could not employ the original flip chip package substrate for the first chip 100a to flip chip bonding to a second flip chip 100b. However, as shown in FIG. 3, the flip chip package substrate 200 of the present invention can be flip chip bonded to the first chip 100a and the second chip 100b.

Referring to FIGS. 2 and 3, the top face of the substrate 200 is provided with a plurality of bump pad groups 204, which are respectively provided with a first bump pad 204a and a second bump pad 204. The first bump pad and the second bump pad of the same bump pad group can be electrically connected with each other via a trace 206 formed of the conductive layer (e.g. conductive layer 23a in FIG. 1) for a single current path. Thus, beside flip chip boning to the first pads 104a of the first chip 100a by the first bump pads 204a, the substrate 200 can be flip chip bonded to the second pad 104b of the second chip 100b by the second pads 204a. Thus, the first chip 100a and the second chip 100b can be respectively flip chip bonded to the top face 202 of the substrate 200 by the first bump pads 204a and the second bump pads 204b of the bump pad groups 204, and accordingly, sharing the same substrate 200.

Figure 4:
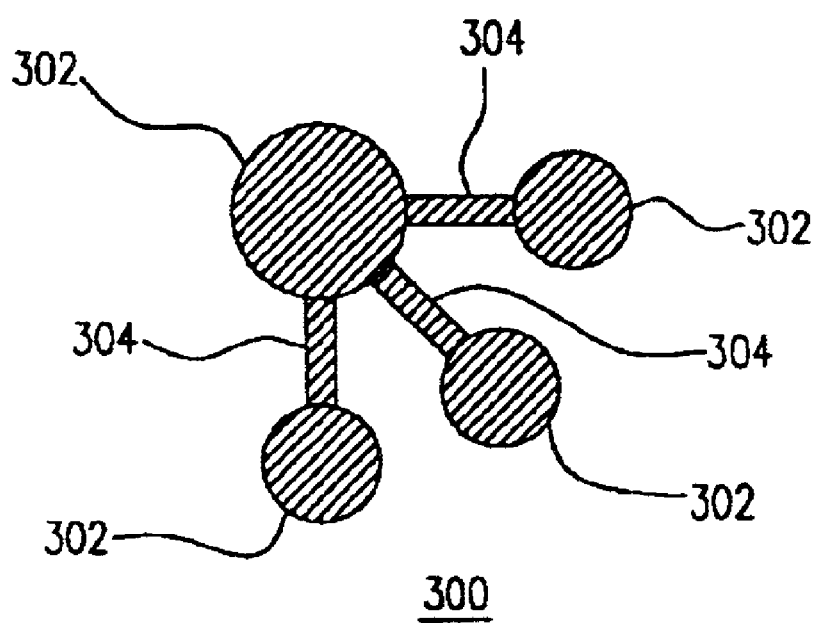
FIG. 4 shows a plurality of bump pad groups having a plurality of bump pads in accordance with the present invention in FIG. 3.

Referring to FIG. 4, which shows the bump pad groups having a plurality of bump pads in FIG. 3. In order to make the flip chip package substrate 200 (shown in FIG. 3) to be flip chip boned to one of chips having pads in a same pad arrangement but with different pad pitches, the bump pad group 300 is further provided with a plurality of bump pads 302 and the number of bump pads 302 is corresponding to chip number of the substrate of FIG. 2 and not only limited to four bump pads shown in FIG. 4. The bump pads 302 are connected with each other similarly by traces 304 (e.g. trace 206 shown in FIG. 3) for a single current path.

In order to prevent bumps made of Sn—Pb alloy collapse onto the surface of the trace 206 in FIG. 3 and the trace 304 in FIG. 4, a solder mask layer 27a shown in FIG. 1 is used to cover the traces of the conductive layer 23a (e.g. trace 206 in FIG. 3 and traces 304 in FIG. 4) such that the solder mask layer 27a only exposes the bump pad 302 of the bump pad group 300 shown in FIG. 4, and cover the traces 304 used for electrically connecting the bump pads 302.

The flip chip package substrate of the present invention can be correspondingly flip chip bonding to a first chip, a second chip, and so on, wherein these chips are of similar pad arrangement but of different pad pitches. The top face of the flip chip package substrate of the present invention is provided with a plurality of bump pad groups and these groups respectively includes a plurality of bump pads, in the sequence of first bump pad, a second bump pad, and so on, and the bump pads of the same bump pad group are electrically connected with each other, and the positions of the first bump pads are corresponding to the positions of the pads of the first chip. The positions of the second bump pads are respectively corresponding to the positions of the pads of the second chip, and the rest may be inferred by analogy. Accordingly, the flip chip package substrate of the present invention can be correspondingly flip chip bonding to the first chip, the second chip and so on, and therefore it is not required to re-design a new flip chip package substrate with respect to a different chip.

In summary, the flip chip package substrate of the present invention can be correspondingly flip chip bonding to one of chips having pads in a same pad arrangement type but with different pad pitches such that these chips can share the same flip chip package substrate in accordance with the present invention. Therefore, the design procedure of the flip chip package substrate is not needed. Accordingly, the process time for flip chip package of chip is reduced.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A flip chip package substrate for flip chip bonding to either a first chip or a second chip, wherein the first chip is provided with a first active surface and a plurality of first pads, and the first pads are disposed on the first active surface in an arrangement, and the second chip is provided with a second active surface and a plurality of second pads, and the second pads are corresponding to the arrangement of the first pads and disposed on the second active surface, the flip chip package substrate comprises:

a plurality of patterned conductive layers, inter-stacked in sequence;

at least an insulation layer, positioned between any two adjacent conductive layers for isolation the conductive layers and inter-stacked with the conductive layers; and a plurality of conductive vias, respectively passing through the insulation layer for electrically connecting the conductive layers, wherein the top layer of the conductive layers is provided with a plurality of bump pad groups and the bump pad groups are respectively provided with a first bump pad and a second bump pad, and the first bump pad and the second bump pad of the same bump pad group are electrically connected with each other, and the positions of the first bump pads are respectively corresponding to the positions of the first pads of the first chip and the positions of the second bumps are respectively corresponding to the positions of the second pads of the second chip.

2. The flip chip package substrate of claim 1, wherein the first bump pad and the second bump pad of the same bump pad group are electrically connected with each other by conductive traces formed of the top layer of the conductive layers.

3. The flip chip package substrate of claim 1, further comprising a patterned solder mask layer covered the top layer of the conductive layers and the insulation layer and expose the first bump pad and the second bump pad.

4. A flip chip package substrate for flip chip bonding to either a first chip and a second chip, wherein the first chip is provided with a first active surface and a plurality of first pads, and the first pads are deposited on the first active surface in an arrangement, and the second chip is provided with a second active surface and a plurality of second pads, and the second pads are corresponding to the arrangement of the first pads, and deposited on the second active surface, and the flip chip package substrate is provided with a plurality of bump pad groups deposited on the top face of the flip chip package substrate, and the bump pad groups are respectively provided with a first bump pad and a second bump pad, and the first bump pad and the second bump pad of the same bump pad group are electrically connected with each other and the positions of the first bump pads are corresponding to the positions of the first pads of the first chip, and the positions of the second bump pads are respectively corresponding to the positions of the second pads of the second chip.

5. The flip chip package substrate of claim 1, further comprising a patterned solder mask layer covered the top face of the flip chip package substrate, and expose the first bump pads and the second bump pads.

* * * * *